United States Patent
Fürst et al.

(10) Patent No.: US 7,073,723 B2
(45) Date of Patent: Jul. 11, 2006

(54) THIN ELECTRONIC CHIP CARD AND METHOD OF MAKING SAME

(75) Inventors: Stefan Fürst, Rainau (DE); Michael Moser, Rainau (DE); Heinrich Stelzig, Ellwangen (DE); Claudia Rathmann, Ellwangen (DE); Fatima Birke-Salam, Ellwangen (DE); Dejan Ilic, Ellwangen (DE); Ulrich Bosch, Nördlingen (DE); Thomas Woehrle, Ellwangen (DE)

(73) Assignee: Varta Microbattery GmbH (DE)

( * ) Notice: Subject to any disclaimer, the term of this patent is extended or adjusted under 35 U.S.C. 154(b) by 182 days.

(21) Appl. No.: 10/766,367

(22) Filed: Jan. 28, 2004

(65) Prior Publication Data

US 2004/0182939 A1    Sep. 23, 2004

(30) Foreign Application Priority Data

Jan. 31, 2003    (DE) ................... 103 04 824

(51) Int. Cl.
*G06K 19/06* (2006.01)
(52) U.S. Cl. ..................... 235/492; 235/488
(58) Field of Classification Search ............ 235/492, 235/488; 439/500, 68
See application file for complete search history.

(56) References Cited

U.S. PATENT DOCUMENTS

| | | | |
|---|---|---|---|
| 4,792,843 A * | 12/1988 | Haghiri-Tehrani et al. .. | 257/679 |
| 4,876,441 A * | 10/1989 | Hara et al. ................. | 235/488 |
| 4,966,857 A * | 10/1990 | Haghiri-Tehrani et al. .. | 156/293 |
| 5,558,957 A | 9/1996 | Datta et al. | |
| 5,773,812 A * | 6/1998 | Kreft ......................... | 235/492 |
| 5,888,624 A * | 3/1999 | Haghiri et al. ............ | 428/195.1 |
| 6,077,106 A * | 6/2000 | Mish ........................... | 439/500 |
| 6,372,387 B1 * | 4/2002 | Kawakami et al. ........ | 429/303 |
| 6,568,600 B1 * | 5/2003 | Carpier et al. ............. | 235/492 |
| 6,906,120 B1 * | 6/2005 | Davis et al. ............... | 523/436 |
| 2002/0007906 A1 | 1/2002 | Droz | |
| 2002/0047049 A1 | 4/2002 | Perron et al. | |
| 2002/0095960 A1 | 7/2002 | Grover | |

FOREIGN PATENT DOCUMENTS

| | | |
|---|---|---|
| DE | 196 45 071 A | 7/1998 |
| DE | 101 02 125 A1 | 7/2002 |
| DE | 102 26 848 A1 | 12/2003 |
| EP | 0 764 691 A2 | 6/1996 |
| EP | 0 997 959 B1 | 5/2000 |
| JP | 2001319210 | * 11/2001 |

OTHER PUBLICATIONS

T. Haghiri, "Vom Plastik Zur Chipkarte" 1999, Carl Hanser Verlag, Munchen, XP002282743 *Seite 97, Zeile II-Zeile 22*

* cited by examiner

*Primary Examiner*—Thien M. Le
*Assistant Examiner*—Kimberly D. Nguyen
(74) *Attorney, Agent, or Firm*—DLA Piper Rudnick Gray Cary US LLP

(57) ABSTRACT

A thin electronic chip card with an IC chip and a galvanic element as an energy store, which has at least one lithium-intercalating electrode and has a thin, flexible housing comprising two metal foils, which bear directly against the electrodes and are connected to each other in a sealed manner with an adhesive or sealing layer, the element is arranged in a recess in the chip card and the chip card and the element are covered on both sides by an overlay plastic film, which is firmly bonded to the chip card and the element with an elastic stress-compensating adhesive, which adheres simultaneously on metals and plastics.

18 Claims, 2 Drawing Sheets

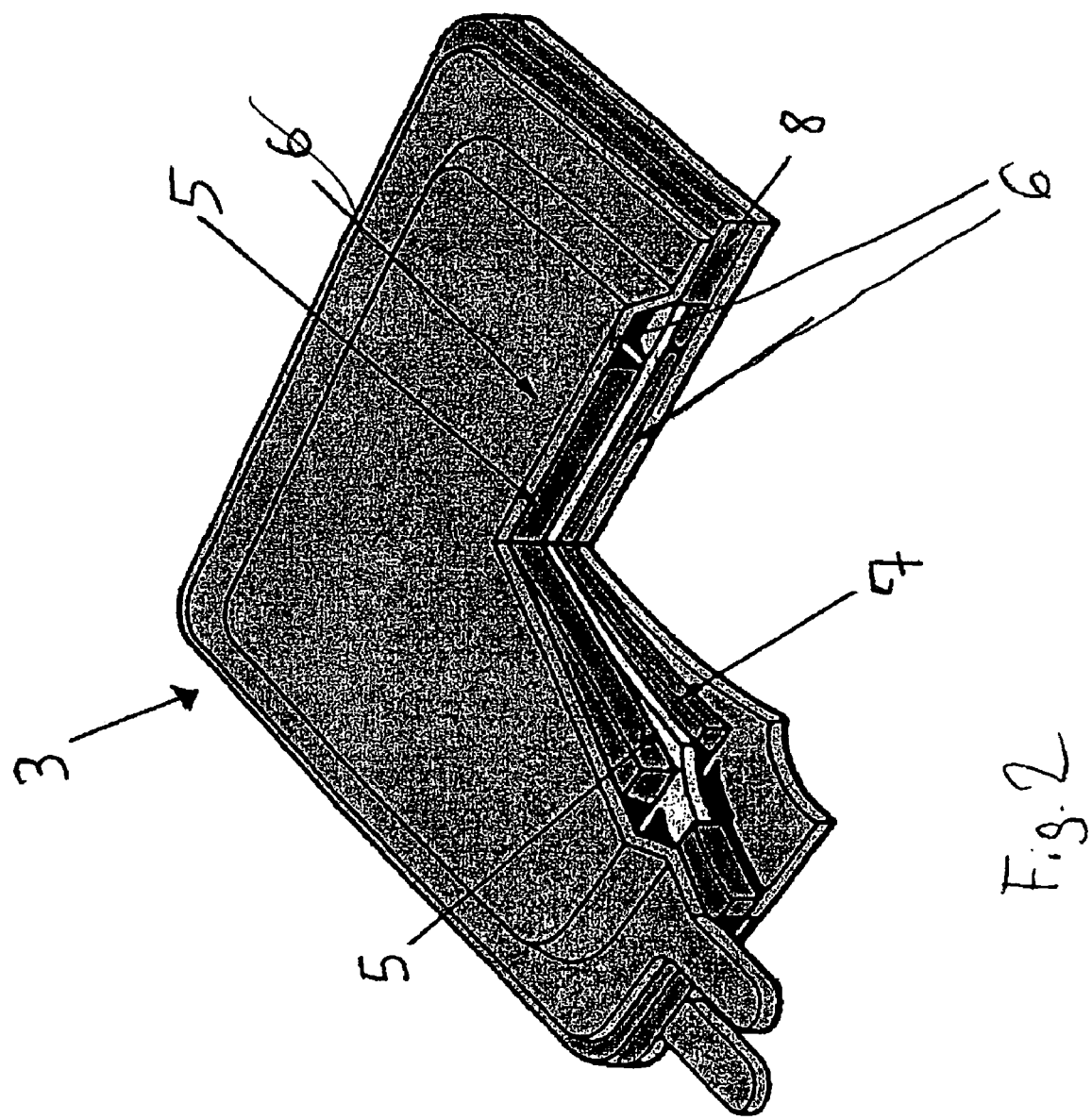

THIN ELECTRONIC CHIP CARD AND METHOD OF MAKING SAME

RELATED APPLICATION

This application claims priority of German Patent Application No. 103 04 824.3, filed Jan. 31, 2003.

FIELD OF THE INVENTION

The subject-matter of the invention relates to a thin electronic chip card with an IC chip and a galvanic element as an energy store, which has at least one lithium-intercalating electrode and a thin, flexible housing comprising two metal foils, which bear directly against the electrodes and are connected to each other in a sealed manner by an adhesive or sealing layer.

BACKGROUND

In "Active Smart Cards", extremely thin, flexible galvanic elements with a total thickness of, for example, less than 0.5 mm are used as energy stores. In the case of such thin electronic chip cards, the flat energy store is provided for supplying power to the IC chip or other components such as integrated miniature sensors or transponders.

Such a smart card must conform to ISO standards in its overall form comprising the card body, components and energy store in terms of being flexurally resistant in accordance with DIN-ISO 7816-1 and DIN ISO/IEC 10 373, i.e., the ISO bending test in accordance with DIN-ISO 7816-1 and the test specification in accordance with DIN ISO/IEC 10 373 must be satisfied. In the dynamic bending test, the card is flexed 2 cm in length and 1 cm in width with a frequency of 30 bends per minute (=0.5 Hz). In this test, a card must remain undamaged after at least 250 bends in each of the four possible directions (that is altogether 1000 bends). In the dynamic torsion test, the card is loaded ±15° about the longitudinal axis with a frequency of 30 bends per minute (=0.5 Hz). The standard demands 1000 torsions without the chip functionality failing or any mechanical damage being visible on the card.

In the previously used methods of hot and cold lamination, the metal housing of the element was often damaged so that the overall system of the card became unusable. If the housing was introduced into the chip card by cold lamination with known adhesives such as, for example, commonly used two-component polyurethane adhesives, cracks often occurred when the ISO bending tests were carried out.

EP 0 997 959 B1 describes galvanic elements with a non-aqueous electrolyte which have housings comprising laminate films. Such laminates generally comprise a composite aluminum foil coated on both sides, which can easily be deep-drawn to 5 mm and, on the basis of this property, immediately passes the ISO test. The plastic encapsulation thereby prevents tearing.

In DE 101 02 125.9, the mechanical reinforcement of an electronic chip card with a galvanic element arranged in it by means of a partial or complete coverage comprising metal or fiber-reinforced plastic is described.

A further possibility for stabilizing the metal housing is proposed in DE 102 26 848.7. In that application, in the case of a galvanic element with at least one lithium-intercalating electrode and a thin, flexible housing comprising two metal foils which bear directly against the electrodes and are connected to each other in sealed manner by means of an adhesive or sealing layer, at least one of the metal foils is provided on the outer side with a layer of plastic increasing the stability and strength, and an adhesive layer is arranged between the metal foil and the layer of plastic. Such a galvanic element must, however, be transformed into a laminated structure in further method steps.

It would therefore be advantageous to provide an active chip card which meets the high requirements in terms of mechanical stability with respect to flexural stresses and torsional stresses and which can be easily produced and is constructed from a few layers.

SUMMARY OF THE INVENTION

This invention relates to a thin electronic chip card including an IC chip in a core film; a galvanic element as an energy store, which has at least one lithium-intercalating electrode and a thin, flexible housing including two metal foils, which bear directly against the electrodes and are connected to each other in a sealed manner with an adhesive or sealing layer, arranged in a recess in the core film; an elastic stress-compensating adhesive layer which adheres to metals and plastics covered over both sides of the core film and the element; and an overlay plastic film applied to each of the adhesive layers to firmly bond the core film and the element.

This invention also relates to a method of producing a thin electronic chip card including forming a core film with an IC chip; forming a recess in the core film; placing a galvanic element in the recess; applying an adhesive layer onto both sides of the core film and the galvanic element; applying a plastic overlay film onto the adhesive layers; and causing the adhesive layers to cure.

BRIEF DESCRIPTION OF THE DRAWINGS

FIG. 2 is a schematic sectional view of a galvanic element which can be used according to the invention.

DETAILED DESCRIPTION

Figure 1:
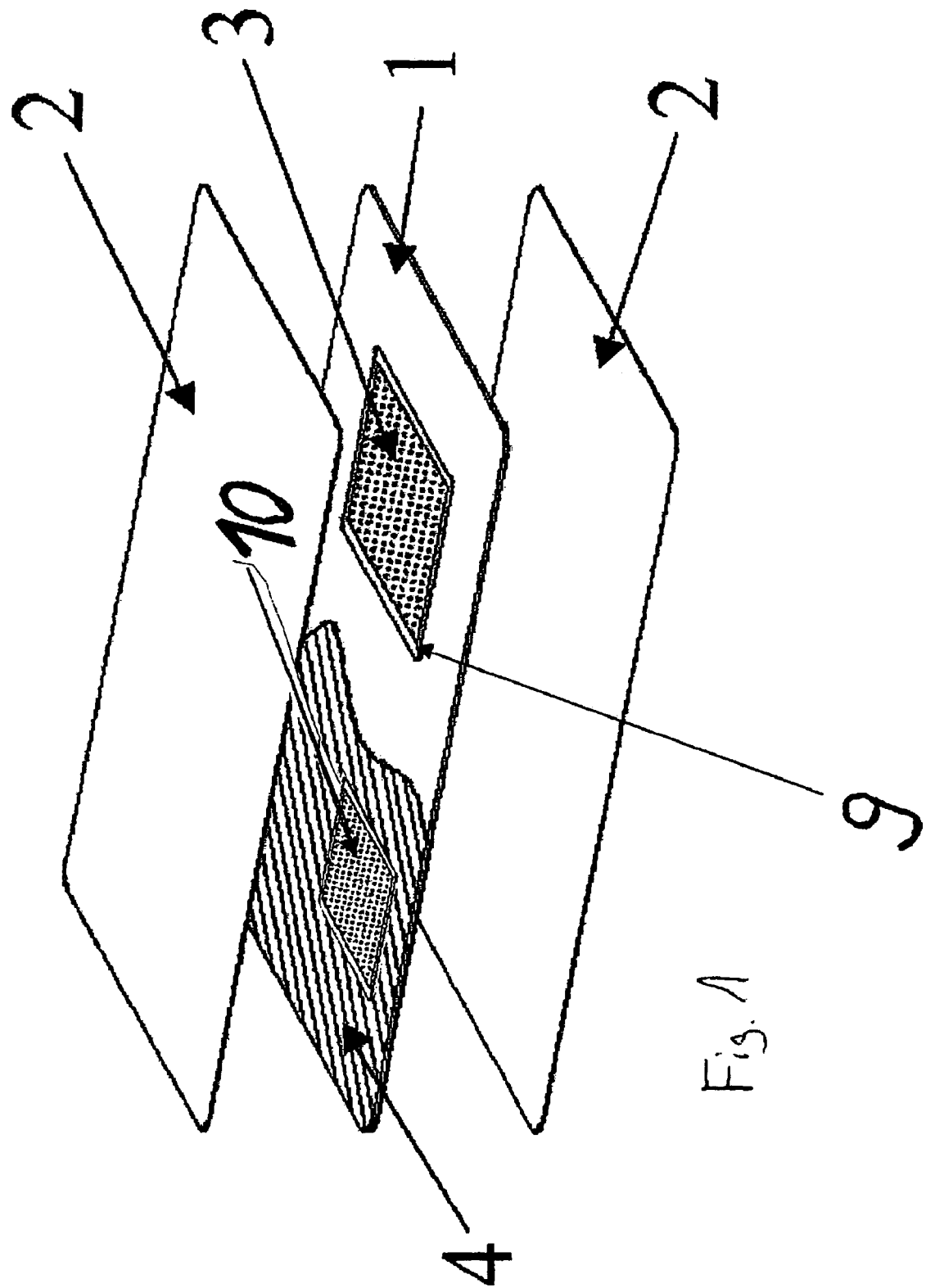
FIG. 1 is a schematic perspective view of a thin electronic chip card in accordance with aspects of the invention, broken into separate layers for ease of understanding.

It will be appreciated that the following description is intended to refer to specific embodiments of the invention selected for illustration in the drawings and is not intended to define or limit the invention, other than in the appended claim.

According to aspects of the invention, laminating a galvanic element 3 (see FIG. 2) with at least one lithium-intercalating electrode 5 and a thin, flexible housing 6 comprising two metal foils which bear directly against the electrodes 5, 7 and are connected to each other in a sealed manner by an adhesive or sealing layer 8 into a smart card is performed at ambient temperature with an elastic adhesive 4. A smart card or chip card is in this case a multi-layered, flexible plastic composite which has functions such as, for example, sensor technology, data storage and retrieval and the like.

As can be seen from FIG. 1, the galvanic element 3 is arranged in a recess 9 in the chip card and the chip card and the element are covered on both sides by an overlay plastic film 2, which is firmly bonded to the chip card and the element with an elastic stress-compensating adhesive 4 which adheres simultaneously on metals and plastics. The overlay plastic films 2 are applied by cold lamination.

In the case of hot lamination, layers of plastic are fused to one another over at least portions of their surface areas by pressure and the action of relatively high temperatures (typically over about 100° C.). In this case, the areas remain permanently adhered to one another and a composite comprising the films of plastic used is obtained. An energy-saving alternative to hot lamination is so-called "cold lamination." As in the case of hot lamination, pressure is exerted on the films which are disposed one on top of the other. However, the bonding together of the areas to be adhesively bonded is performed at ambient temperature (room temperature) or at heating temperatures of up to about 50° C. A single-component adhesive according to the invention is a free-flowing, viscous composition which encapsulates the galvanic element, embeds the smart card and, after polymerization (curing), brings about permanent area adhesion in relation to the films of the card and the metallic housing surface of the galvanic element.

The adhesive should have a glass transition temperature of between about 35° C. and about 70° C. and an elongation at break of about 40—about 52% in accordance with DIN ISO 527 and be light-cured. In particular, the adhesive is most preferably an epoxy resin or a thermoplastic polyurethane-based material.

The overlay plastic film is preferably PVC. The area adhesive bonds in the card, the overlay film to the core film, the metallic surface of the housing to the overlay film and the metallic housing to the core film, are produced by cold lamination.

The use according to the invention of an elastic adhesive, that is a stress-compensating adhesive, together with curing which preferably takes place at room temperature allows the overall smart-card—adhesive—flat-cell system to be transformed into a mechanically stable system which is designed overall for a high load-bearing capacity during the ISO bending tests.

When tests were carried out with other, generally more brittle adhesives, a reject rate of 20%-100% was obtained. When a stress-compensating, light-activatable epoxy resin with an elongation at break of about 40%— about 52% in accordance with DIN EN ISO 527 and a glass transition temperature of about 45°—about 49° C. was used, no damage occurred to the galvanic element or the battery or to the card.

The glass temperature or glass transition temperature ($T_g$) is the temperature at which amorphous or partially crystalline polymers transform from a rubber-elastic or liquid state into a hard-elastic or glassy state, or vice versa. The phenomenon is based on the freezing or thawing of the Brownian molecular movement of relatively long chain segments of the polymer. If the glass temperature is reached, the physical properties are changed considerably. Examples of this are the viscosity or the hardness.

Particularly advantageous for the characteristics in the bending test is the fact that the epoxy resins used with preference according to the invention, which exhibited advantageous properties in testing, have a relatively low glass temperature, which lies at approximately 50° C. Consequently, these cured epoxy resins are more elastic than those which have a glass temperature of, for example, 140° C., and are consequently brittle and suffer cracks in the ISO bending test.

Epoxy resins are organic, usually oligomeric compounds which have, in particular, an epoxy group and can be transformed by polymerization methods into so-called "thermosetting" materials ("curing"). The shrinkage in the curing process is low, the cured products are stress-free and tear-resistant, which is of great advantage for the bending test. Furthermore, these epoxy resins adhere to metallic surfaces such as, for example, copper and transform thin copper, which on its own account is considered mechanically unstable, into an elastic and stable overall composite of epoxy resin with copper.

A thin electronic chip card according to the invention with an IC chip 10 and a galvanic element 3 as an energy store is schematically represented in FIG. 1. Positions of the galvanic element 3 and the IC chip 10 can be determined at choice of the designer of the electronic chip card.

Serving as the card material is a core film 1 comprising a PVC/ABS blend (where PVC is polyvinyl chloride, ABS is acrylonitrile-butadiene-styrene copolymer), which contains a galvanic element 3 in a recess 9. The overlay film 2 is of PVC.

An advantageous adhesive 4 is a modified single-component epoxy resin (for example, the product Katiobond® of the DELO company, Germany). Curing is performed by light activation with visible light. An outstanding property which is of significance for the use of galvanic elements with a copper housing in the smart card is the excellent adhesive bonding to metal surfaces. The final strength is typically achieved after 24 h.

Epoxy resins have good chemical resistance and are nontoxic. These special epoxy resins have low shrinkage during the curing process and produce stress-free and tear-resistant plastics after curing. This provides a considerable advantage in the bending test.

As an alternative adhesive according to the invention, a thermoplastic polyurethane-based adhesive, for example, Henkel TPU QR 4663, can be successfully used.

For producing the thin electronic chip card, the core film 1 is punched out to form recesses so that the galvanic element 3 and the IC chip 10 can be placed in. Then, a metered amount of adhesive is spread out on the core film 1 over its full area by a doctor blade. In this case, the adhesive 4 also flows into a cavity between the core film 1 and the galvanic element 3. After that, the overlay film 2 is placed on the film, this preliminary stage for the laminated card is turned over, the doctor-blading operation is repeated and the second overlay film 2 is placed on the film. After pressing of the card (without introduction of heat), it is exposed to light to initiate the curing operation.

The invention claimed is:

1. A thin electronic chip card comprising:
   an IC chip in a core film;
   a galvanic element as an energy store, which has at least one lithium-intercalating electrode and a thin, flexible housing comprising two metal foils, which bear directly against the electrodes and are connected to each other in a sealed manner with an adhesive or sealing layer, arranged in a recess in the core film;
   an elastic stress-compensating adhesive layer which adheres to metals and plastics coated over both sides of the core film and the element; and
   an overlay plastic film applied to each of the adhesive layers to firmly bond the core film and the element.

2. The thin electronic chip card according to claim 1, produced by cold lamination of the overlay films to the core film, surfaces of the metallic housing to the overlay films and the metallic housing to the core film.

3. The thin electronic chip card according to claim 1, wherein the adhesive has a glass transition temperature between about 35° C. and about 70° C. and an elongation at break of about 40–about 52%.

4. The thin electronic chip card according to claim 1, wherein the adhesive is light-curable.

5. The thin electronic chip card according to claim 1, wherein the adhesive is an epoxy resin.

6. The thin electronic chip card according to claim 1, wherein the adhesive is a thermoplastic polyurethane-based material.

7. The thin electronic chip card according claim 1, wherein the overlay plastic film is PVC.

8. A thin electronic chip card comprising:
   a core film having opposed sides and a recess;
   an IC chip in the core film;
   a galvanic element located in the recess;
   an adhesive layer having a glass transition temperature between about 35° C. and about 70° C. and an elongation at break of about 40–about 52% applied to both sides of the core film and the galvanic element; and
   a plastic overlay film applied to the adhesive layers.

9. The thin electronic chip card according to claim 8, produced by cold lamination of the overlay films to the core film, surfaces of the metallic housing to the overlay films and the metallic housing to the core film.

10. The thin electronic chip card according to claim 8, wherein the adhesive is light-curable.

11. The thin electronic chip card according to claim 8, wherein the adhesive is an epoxy resin.

12. The thin electronic chip card according to claim 8, wherein the adhesive is a thermoplastic polyurethane-based material.

13. The thin electronic chip card according claim 8, wherein the overlay plastic film is PVC.

14. A method of producing a thin electronic chip card comprising:
    forming a core film with an IC chip;
    forming a recess in the core film;
    placing a galvanic element in the recess;
    applying an adhesive layer having a glass transition temperature between about 35° C. and about 70° C. and an elongation at break of about 40–about 52% onto both sides of the core film and the galvanic element;
    applying a plastic overlay film onto the adhesive layers; and
    causing the adhesive layers to cure.

15. The thin electronic chip card according to claim 14, wherein the adhesive is light-curable.

16. The thin electronic chip card according to claim 14, wherein the adhesive is an epoxy resin.

17. The thin electronic chip card according to claim 14, wherein the adhesive is a thermoplastic polyurethane-based material.

18. The thin electronic chip card according claim 14, wherein the overlay plastic film is PVC.

* * * * *